(12) United States Patent
Sun et al.

(10) Patent No.: US 12,262,575 B2
(45) Date of Patent: Mar. 25, 2025

(54) DISPLAY SUBSTRATE AND DISPLAY DEVICE

(71) Applicant: BOE TECHNOLOGY GROUP CO., LTD., Beijing (CN)

(72) Inventors: Haiyan Sun, Beijing (CN); Xiaojin Zhang, Beijing (CN); Dan Wang, Beijing (CN); Changho Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 871 days.

(21) Appl. No.: 17/312,030

(22) PCT Filed: Aug. 7, 2020

(86) PCT No.: PCT/CN2020/107925
§ 371 (c)(1),
(2) Date: Jun. 9, 2021

(87) PCT Pub. No.: WO2022/027630
PCT Pub. Date: Feb. 10, 2022

(65) Prior Publication Data
US 2022/0336765 A1    Oct. 20, 2022

(51) Int. Cl.
*H10K 50/12* (2023.01)
*H10K 85/40* (2023.01)
*H10K 85/60* (2023.01)

(52) U.S. Cl.
CPC ............ *H10K 50/12* (2023.02); *H10K 85/40* (2023.02); *H10K 85/622* (2023.02); *H10K 85/625* (2023.02); *H10K 85/633* (2023.02); *H10K 85/654* (2023.02); *H10K 85/6572* (2023.02)

(58) Field of Classification Search
CPC ...... H10K 50/12; H10K 85/40; H10K 85/622; H10K 85/625; H10K 85/633; H10K 85/654; H10K 85/6572; H10K 2101/30; H10K 2101/90; H10K 50/121; H10K 50/165; Y02E 10/549
See application file for complete search history.

(56) References Cited

U.S. PATENT DOCUMENTS

| | | | |
|---|---|---|---|
| 2010/0187494 A1* | 7/2010 | Lee | H01L 33/06 257/14 |
| 2013/0240851 A1 | 9/2013 | Seo et al. | |
| 2015/0133662 A1* | 5/2015 | Ahn | H10K 85/631 544/284 |

(Continued)

FOREIGN PATENT DOCUMENTS

| | | |
|---|---|---|
| CN | 104471733 A | 3/2015 |
| CN | 109088008 A | 12/2018 |

(Continued)

*Primary Examiner* — Ratisha Mehta
(74) *Attorney, Agent, or Firm* — Lippes Mathias LLP

(57) ABSTRACT

Provided is a display substrate including a base substrate, an anode layer, a light-emitting layer, an electron diffusion layer, a hole block layer and a cathode layer which are sequentially stacked along a direction away from the base substrate, wherein a material of the electron diffusion layer comprises a first luminescent material, and a transport speed of holes generated by the anode layer in the electron diffusion layer is less than a transport speed of the holes in the light-emitting layer.

19 Claims, 3 Drawing Sheets

(56) References Cited

U.S. PATENT DOCUMENTS

2020/0067008 A1    2/2020  Mou
2020/0321537 A1*  10/2020  Jeon ..................... C09K 11/02
2020/0343457 A1*  10/2020  Weaver ............... H10K 85/633

FOREIGN PATENT DOCUMENTS

| CN | 109713151 A | 5/2019 |
| --- | --- | --- |
| CN | 110752307 A | 2/2020 |
| CN | 111564565 A | 8/2020 |
| JP | 2015142071 A | 8/2015 |
| JP | 2019201042 A | 11/2019 |

* cited by examiner

DISPLAY SUBSTRATE AND DISPLAY DEVICE

CROSS-REFERENCE TO RELATED APPLICATION

This application is a 371 of PCT Application No. PCT/CN2020/107925 filed on Aug. 7, 2020, the disclosure of which is incorporated herein by reference in its entirety.

TECHNICAL FIELD

The present disclosure relates to the field of display technologies, and in particular to a display substrate and a display device.

BACKGROUND

Organic light-emitting diode (OLED) display substrates have been widely used due to their characteristics such as self-luminescence, low driving voltage, and fast response.

SUMMARY

The present disclosure provides a display substrate and a display device.

In one aspect, a display substrate is provided. The display substrate includes:
 a base substrate, and an anode layer, a light-emitting layer, an electron diffusion layer, a hole block layer, and a cathode layer which are sequentially stacked along a direction away from the base substrate,
 wherein a material of the electron diffusion layer includes a first luminescent material, and a transport speed of holes generated by the anode layer in the electron diffusion layer is less than a transport speed of the holes in the light-emitting layer.

Optionally, the material of the electron diffusion layer further includes a first host material and a first sensitizing material; and
 a material of the light-emitting layer includes a second host material, a second sensitizing material, and a second luminescent material, and
 wherein a doping proportion of the first sensitizing material is less than that of the second sensitizing material.

Optionally, a difference between the doping proportion of the second sensitizing material and the doping proportion of the first sensitizing material is greater than 5%.

Optionally, a doping proportion of the first host material is greater than that of the second host material; and
 a doping proportion of the first luminescent material is equal to that of the second luminescent material.

Optionally, a difference between the doping proportion of the first host material and the doping proportion of the second host material is greater than 5%.

Optionally, the doping proportion of the first host material is greater than 50%, the doping proportion of the first sensitizing material is greater than 5% and less than or equal to 50%, and the doping proportion of the first luminescent material is greater than 0.5% and less than or equal to 5%; and
 the doping proportion of the second host material is greater than 50%, the doping proportion of the second sensitizing material is greater than 5% and less than or equal to 50%, and the doping proportion of the second luminescent material is greater than 0.5% and less than or equal to 5%.

Optionally, a difference between the lowest singlet energy of the first host material and the lowest triplet energy of the first host material is greater than or equal to 0.2 eV;
 a difference between lowest singlet energy of the first sensitizing material and lowest triplet energy of the first sensitizing material is less than or equal to 0.2 eV;
 the lowest singlet energy of the first host material is greater than that of the first sensitizing material, and the lowest singlet energy of the first sensitizing material is greater than that of the first luminescent material, wherein a difference between the lowest singlet energy of the first host material and the lowest singlet energy of the first sensitizing material is greater than or equal to 0.1 eV; and
 the lowest triplet energy of the first host material is greater than that of the first sensitizing material, and the lowest triplet energy of the first sensitizing material is greater than the lowest singlet energy of the first luminescent material, wherein a difference between the lowest triplet energy of the first host material and the lowest triplet energy of the first sensitizing material is greater than or equal to 0.1 eV.

Optionally, an absolute value of a difference between highest occupied molecular orbital energy level of the first host material and highest occupied molecular orbital energy level of the first sensitizing material is less than or equal to 0.2 eV;
 a difference between lowest unoccupied molecular orbital energy level of the first host material and lowest unoccupied molecular orbital energy level of the first sensitizing material is less than 0.3 eV; and
 a difference between an absolute value of the highest occupied molecular orbital energy level of the first host material and an absolute value of the lowest unoccupied molecular orbital energy level of the first sensitizing material is greater than the lowest singlet energy of the first sensitizing material.

Optionally, a type of the first host material is identical to that of the second host material;
 a type of the first sensitizing material is identical to that of the second sensitizing material; and
 a type of the first luminescent material is identical to that of the second luminescent material.

Optionally, the first host material and the second host material are both carbazole materials;
 the first sensitizing material and the second sensitizing material are thermally activated delayed fluorescent materials or multiple resonance type materials; and
 the first luminescent material and the second luminescent material are both fluorescent materials.

Optionally, the first host material and the second host material are both one structure selected from a structure represented by formula (I), a structure represented by formula (II), a structure represented by formula (III), a structure represented by formula (IV), a structure represented by formula (V), and a structure represented by formula (VI);

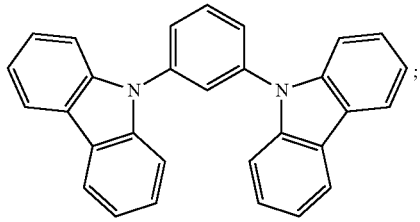

(II)
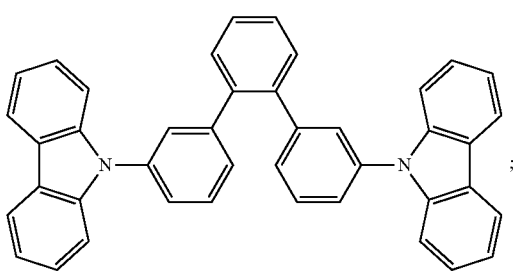
(III)
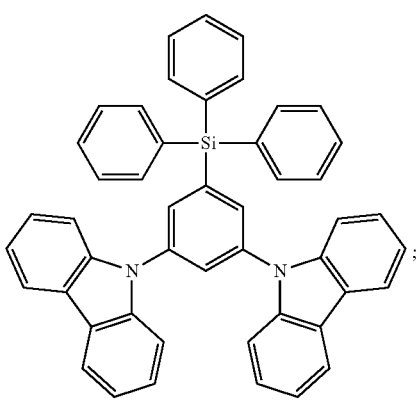
(IV)
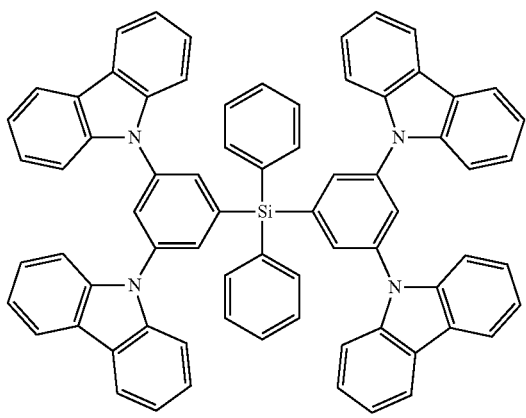
(V)
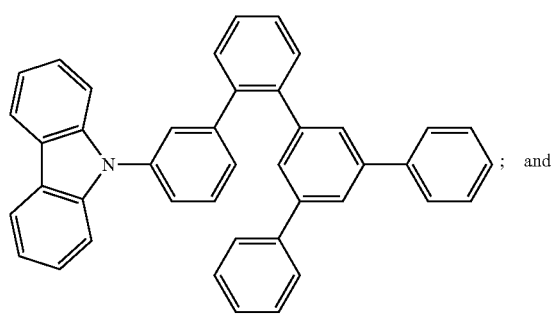
; and
(VI)
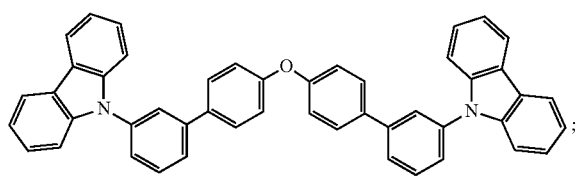
where N is nitrogen and Si is silicon.
Optionally, the first sensitizing material and the second sensitizing material are both one structure selected from a structure represented by formula (VII), a structure represented by formula (VIII), a structure represented by formula (IX), and a structure represented by formula (X);
(VII)
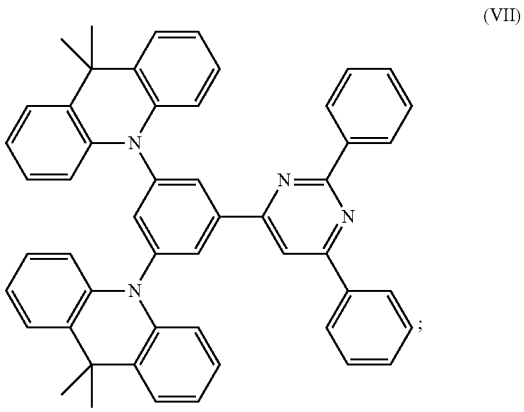
(VIII)
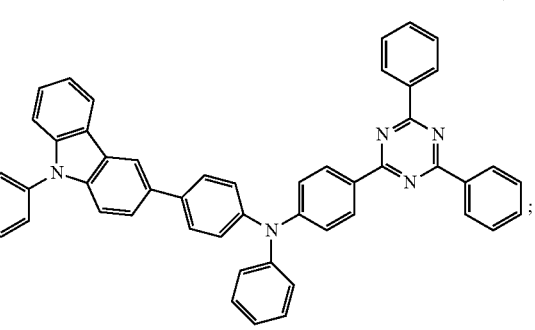
(IX)
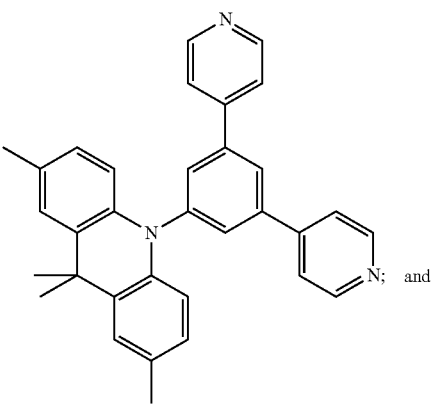
; and -continued (X)

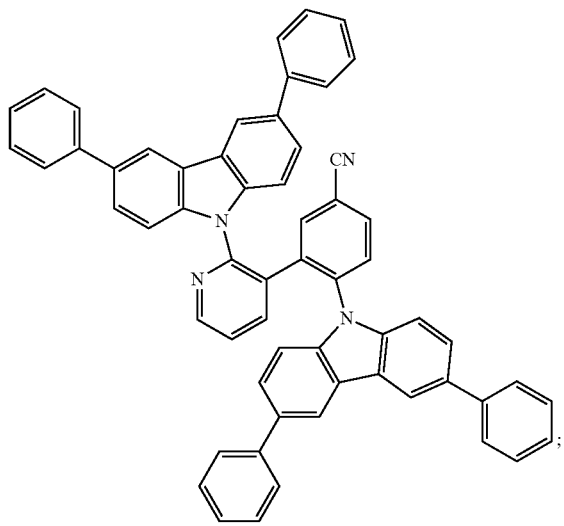

where N is nitrogen and CN is cyano.

Optionally, the first luminescent material and the second luminescent material are both one structure selected from a structure represented by formula (XI), a structure represented by formula (XII), a structure represented by formula (XIII), and a structure represented by formula (XIV);

(XI)

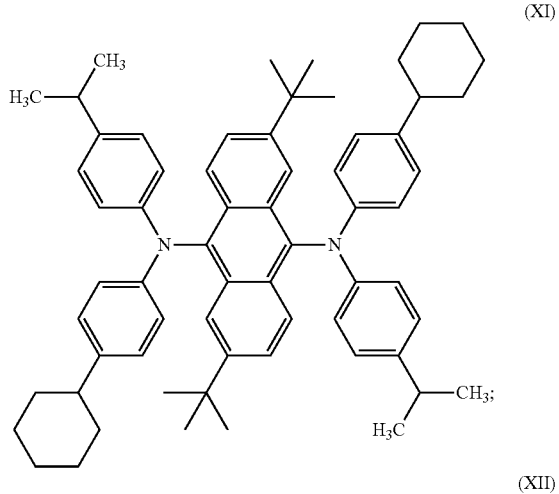

(XII)

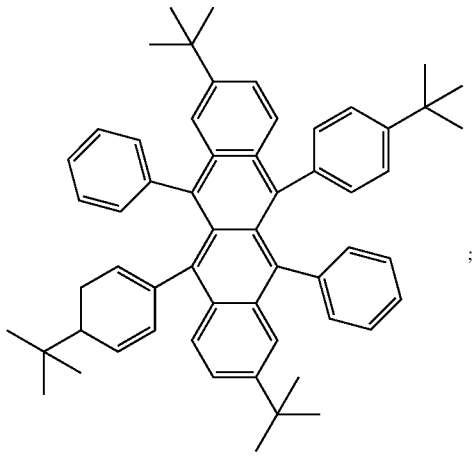

(XIII)

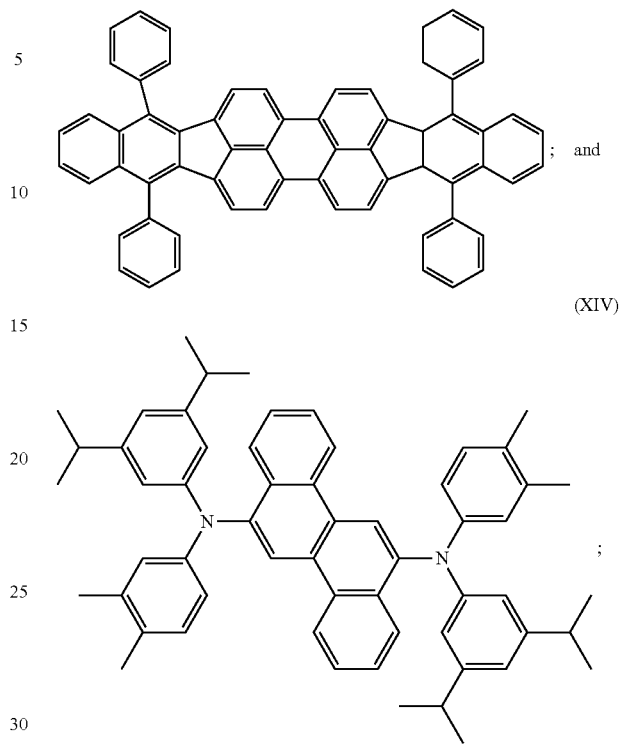; and (XIV)

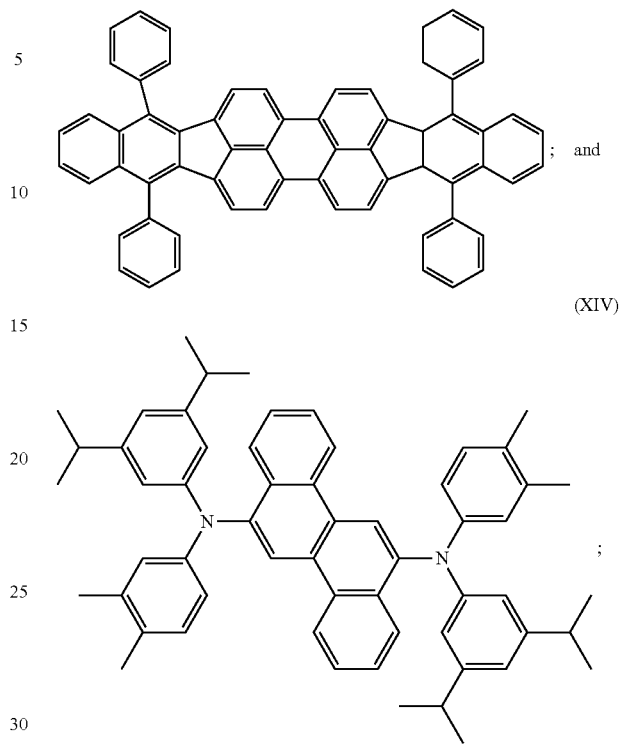;

where N is nitrogen, and both $CH_3$ and $H_3C$ are methyl groups.

Optionally, a thickness of the electron diffusion layer ranges from 1 nanometer to 10 nanometers.

Optionally, the display substrate further includes: an electron transport layer, wherein the electron transport layer is located between the hole block layer and the cathode layer, and an electron mobility of the electron transport layer is greater than or equal to a mobility threshold.

Optionally, the mobility threshold is $10^{-6}$ cm²/V·sec.

Optionally, a material of the electron transport layer includes thiophene materials and lithium quinolate; or, the material of the electron transport layer includes imidazole materials and lithium quinolate; or, the material of the electron transport layer includes azine derivatives and lithium quinolate.

Optionally, a doping proportion of lithium quinolate ranges from 30% to 70%.

Optionally, the display substrate further includes: a hole injection layer, a hole transport layer, an electron block layer, an electron transport layer, an electron injection layer, a capping layer, and an encapsulating layer, wherein the hole injection layer is located on a side of the anode layer away from the base substrate, the hole transport layer is located on a side of the hole injection layer away from the anode layer, the electron block layer is located on a side of the hole transport layer away from the hole injection layer, the electron transport layer is located on a side of the hole block layer away from the base substrate, the electron injection layer is located on a side of the electron transport layer away from the base substrate, the capping layer is located on a side of the cathode layer away from the base substrate, and the encapsulation layer is located on a side of the capping layer away from the cathode layer.

In another aspect, a display device is provided. The display device includes a drive circuit and a display substrate as described in the above aspect, wherein the drive circuit is respectively connected to the anode layer and the cathode layer in the display substrate.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure will be described in detail hereinafter by referring to the accompanying drawings.

In the related art, an OLED display substrate includes an anode layer, a light-emitting layer, a hole block layer, and a cathode layer stacked in sequence. The anode layer can generate holes under the action of a drive voltage provided by a drive circuit, and the cathode layer can generate electrons under the action of the drive voltage provided by the drive circuit. The hole block layer can block the holes generated by the anode layer from being transported to the cathode layer, and can transport the electrons generated by the cathode layer to the light-emitting layer. The holes generated by the anode layer and the electrons generated by the cathode layer can meet in the light-emitting layer to generate excitons, and the excitons can excite the light-emitting layer to emit light.

However, as the transport speed of the holes in the light-emitting layer is greater than the transport speed of the electrons in the light-emitting layer, the holes generated by the anode layer will pass the light-emitting layer first and accumulate at the interface between the light-emitting layer and the hole block layer before the electrons generated by the cathode layer meet the holes generated by the anode layer. As a result, the electrons generated by the cathode layer and the holes generated by the anode layer meet and generate excitons at the interface, rather than in the light-emitting layer, and thus the luminous efficiency of the OLED display substrate is low.

Thermal active delay fluorescent (TADF) technology is a manufacturing technology of organic light-emitting diodes with triplet exciton energy. In the current TADF technology, due to the poor dual transport characteristics of the host material in the light-emitting layer of the OLED display substrate, the transport speed of the holes in the light-emitting layer is greater than the transport speed of the electrons in the light-emitting layer, which affects the luminous efficiency of the OLED display substrate.

Here, the dual transport characteristics of the host material include the ability to transport holes and the ability to transport electrons. Under normal circumstances, the host material has a stronger ability to transport holes and a weaker ability to transport electrons. That is, the transport speed of holes in the light-emitting layer is greater than the transport speed of electrons in the light-emitting layer.

Figure 1:
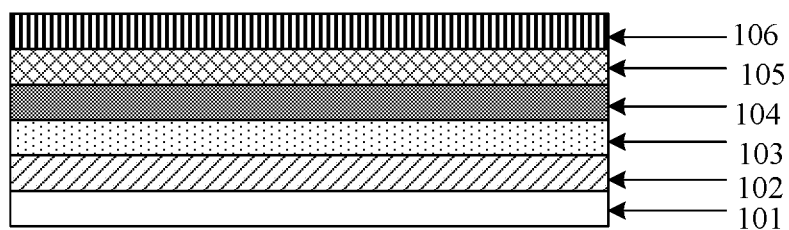
FIG. 1 is a schematic structural diagram of a display substrate according to an embodiment of the present disclosure.

Embodiments of the present disclosure provide a display substrate, which can solve the problem of low luminous efficiency of the display substrate in the related art. Referring to FIG. 1, a display substrate 10 may include a base substrate 101, and an anode layer 102, a light-emitting layer (EML) 103, an electron diffusion layer 104, a hole block layer (HBL) 105, and a cathode layer 106 which are sequentially stacked along a direction away from the base substrate 101.

That is, referring to FIG. 1, the anode layer 102 may be located on a side of the base substrate 101. The light-emitting layer 103 may be located on a side of the anode layer 102 away from the base substrate 101. The electron diffusion layer 104 may be located on a side of the light-emitting layer 103 away from the anode layer 102. The hole block layer 105 may be located on a side of the electron diffusion layer 104 away from the light-emitting layer 103. The cathode layer 106 may be located on a side of the hole block layer 105 away from the electron diffusion layer 104.

In the embodiments of the present disclosure, the material of the electron diffusion layer 104 may include a first luminescent material C1. A transport speed of holes generated by the anode layer 102 in the electron diffusion layer 104 is less than the transport speed of the holes in the light-emitting layer 103.

Since the transport speed of the holes in the electron diffusion layer 104 is relatively low, the holes generated by the anode layer 102 will not be transported to the interface between the electron diffusion layer 104 and the hole block layer 105 before electrons generated by the cathode layer 106 meet the holes generated by the anode layer 102, but can only be transported to the electron diffusion layer 104. That is, the holes generated by the anode layer 102 and the electrons generated by the cathode layer 106 will meet and generate excitons in the electron diffusion layer 104. Moreover, as the material of the electron diffusion layer 104 includes the first luminescent material C1, the electron diffusion layer 104 is also able to emit light. The excitons generated by the meeting of the holes and the electron in the electron diffusion layer 104 can excite the first luminescent material C1 to cause the electron diffusion layer 104 to emit light, and thus the luminous efficiency of the display substrate is relatively high.

In summary, the embodiments of the present disclosure provide a display substrate. In the display substrate, an electron diffusion layer including a first luminescent material is newly added, and the transport speed of holes generated by the anode layer of the display substrate in the electron diffusion layer is less than the transport speed of the holes in the light-emitting layer. Thus, the holes generated by the anode layer and electrons generated by the cathode layer can meet and generate excitons in the electron diffusion layer, which can excite the first luminescent material of the electron diffusion layer to cause the electron diffusion layer to emit light, thus improving the luminous efficiency of the display substrate.

In the embodiments of the present disclosure, the material of the electron diffusion layer 104 may further include a first host material A1 and a first sensitizing material B1. The material of the light-emitting layer 103 may include a second host material A2, a second sensitizing material B2, and a second luminescent material C2.

Optionally, the electron diffusion layer 104 may be formed by multi-source co-evaporation of the first host material A1, the first sensitizing material B1, and the first luminescent material C1; or, may be formed by pre-mixing followed by evaporation of the first host material A1, the first sensitizing material B1, and the first luminescent material C1. The light-emitting layer 103 may be formed by multi-source co-evaporation of the second host material A2, the second sensitizing material B2, and the second luminescent material C2; or, may be formed by pre-mixing followed by evaporation of the second host material A2, the second sensitizing material B2, and the second luminescent material C2.

The doping proportion of the first sensitizing material B1 may be less than that of the second sensitizing material B2. As the hole transport speed is positively correlated to the doping proportion of the sensitizing material (that is, the smaller the doping proportion of the sensitizing material is, the less the hole transport speed is; and the greater the doping proportion of the sensitizing material is, the higher the hole transport speed is), when the doping proportion of the first sensitizing material B1 is less than that of the second sensitizing material B2, the transport speed of the holes in the electron diffusion layer 104 can be less than the transport speed of the holes in the light-emitting layer 103.

In an exemplary embodiment, a difference between the doping proportion of the second sensitizing material B2 and the doping proportion of the first sensitizing material B1 may be greater than 5%.

In the embodiment of the present disclosure, since the doping proportion of the first sensitizing material B1 in the electron diffusion layer 104 is relatively small, a doping proportion of the first host material A1 in the electron diffusion layer 104 can be increased accordingly. As a result, the doping proportion of the first host material A1 is greater than that of the second host material A2. Moreover, the doping proportion of the first luminescent material C1 can be made equal to that of the second luminescent material C2, so as to guarantee the luminous efficiency of the electron diffusion layer 104 under excitation of the excitons and the luminous efficiency of the light-emitting layer 103 under excitation of the excitons.

In an exemplary embodiment, a difference between the doping proportion of the first host material A1 and the doping proportion of the second host material A2 is greater than 5%.

Here, the doping proportion of the first host material A1 refers to the doping proportion of the first host material A1 in the mixed materials included in the electron diffusion layer 104. The doping proportion of the first sensitizing material B1 refers to the doping proportion of the first sensitizing material B1 in the mixed materials included in the electron diffusion layer 104. The doping proportion of the first luminescent material C1 refers to the doping proportion of the first luminescent material C1 in the mixed materials included in the electron diffusion layer 104. The doping proportion of the second host material A2 refers to the doping proportion of the second host material A2 in the mixed materials included in the light-emitting layer 103. The doping proportion of the second sensitizing material B2 refers to the doping proportion of the second sensitizing material B2 in the mixed materials included in the light-emitting layer 103. The doping proportion of the second luminescent material C2 refers to the doping proportion of the second luminescent material C2 in the mixed materials included in the light-emitting layer 103.

Optionally, the doping proportion a1 of the first host material A1 may be greater than 50%, that is, a1>50%. The doping proportion b1 of the first sensitizing material B1 may be greater than 5% and less than or equal to 50%, that is, $50\% \geq b1 > 5\%$. The doping proportion c1 of the first luminescent material C1 may be greater than 0.5% and less than or equal to 5%, that is, $5\% \geq c1 < 0.5\%$.

Moreover, the doping proportion a2 of the second host material A2 may be greater than 50%, that is, a2>50%. The doping proportion b2 of the second sensitizing material B2 may be greater than 5% and less than or equal to 50%, that is, $50\% \geq b2 > 5\%$. The doping proportion c2 of the second luminescent material C2 may be greater than 0.5% and less than or equal to 5%, that is, $5\% \geq c2 > 0.5\%$.

In the embodiments of the present disclosure, the thickness of the light-emitting layer 103 may range from 10 nm (nanometers) to 30 nm. The second sensitizing material B2 has a delayed fluorescence characteristic. The difference between the lowest singlet energy S1(B2) of the second sensitizing material B2 and the lowest triplet energy T1(B2) of the second sensitizing material is less than or equal to 0.2 eV, that is, $S1(B2)-T1(B2) \leq 0.2$ electron volts (eV). Moreover, the luminous efficiency of the second sensitizing material B2 accounts for less than 10% of the total luminous efficiency of the display substrate. The luminous efficiency of the second luminescent material C2 accounts for more than 90% of the total luminous efficiency of the display substrate.

In the embodiments of the present disclosure, the conditions that need to be met by the material in the electron diffusion layer 104 include:

(1) The difference between the lowest singlet energy S1(A1) of the first host material A1 and the lowest triplet energy T1(A1) of the first host material A1 is greater than or equal to 0.2 eV, that is, $S1(A1)-T1(A1) \geq 0.2$ eV.

(2) The difference between the lowest singlet energy S1(B1) of the first sensitizing material B1 and the lowest triplet energy T1(B1) of the first sensitizing material B1 is less than or equal to 0.2 eV, that is, $S1(B1)-T1(B1) \leq 0.2$ eV.

(3) The lowest singlet energy S1(A1) of the first host material A1 is greater than the lowest singlet energy S1(B1) of the first sensitizing material B1, and the lowest singlet energy S1(B1) of the first sensitizing material B1 is greater than the lowest singlet energy S1(C1) of the first luminescent material C1, that is, $S1(A1) > S1(B1) > S1(C1)$. The difference between the lowest singlet energy S1(A1) of the first host material A1 and the lowest singlet energy S1(B1) of the first sensitizing material B1 is greater than or equal to 0.1 eV, that is, $S1(A1)-S1(B1) \geq 0.1$ eV.

(4) The lowest triplet energy T1(A1) of the first host material A1 is greater than the lowest triplet energy T1(B1) of the first sensitizing material B1, and the lowest triplet energy T1(B1) of the first sensitizing material B is greater than the lowest triplet energy T1(C1) of the first luminescent material C1, that is, $T1(A1) > T1(B1) > T1(C1)$. Here, the difference between the lowest triplet energy T1(A1) of the first host material A1 and the lowest triplet energy T1(B1) of the first sensitizing material B1 is greater than or equal to 0.1 eV, that is, $T1(A1)-T1(B1) \geq 0.1$ eV.

(5) The absolute value of the difference between the highest occupied molecular orbital (HOMO) energy level of the first host material A1 and the HOMO energy level of the first sensitizing material B1 is less than or equal to 0.2 eV, that is |HOMO(A1)−HOMO(B1)|≤0.2 eV. The difference between the lowest unoccupied molecular orbital (LUMO) energy level of the first host material A1 and the LUMO energy level of the first sensitizing material B1 is less than 0.3 eV, that is |LUMO(A1)−LUMO(B1)|<0.3 eV. The difference between the absolute value of the HOMO energy level of the first host material and the absolute value of the LUMO energy level of the first sensitizing material B1 is greater than the lowest singlet energy S1(B1) of the first sensitizing material B1, that is |HOMO(A1)|−|LUMO(B1)|>S1(B1).

In the embodiments of the present disclosure, the first host material A1, the first sensitizing material B1, and the first luminescent material C1 may be selected from any materials satisfying the above conditions (1) to (5).

Moreover, the type of the second host material A2 may be identical to that of the first host material A1. The type of the second sensitizing material B2 may be identical to that of the first sensitizing material B1. The type of the second luminescent material C2 may be identical to that of the first luminescent material C1.

Optionally, the first host material A1 and the second host material A2 may both be carbazole materials. The first sensitizing material B1 and the second sensitizing material B2 may both be thermally activated delayed fluorescent materials or multiple resonance type materials. The first luminescent material C1 and the second luminescent material C2 may both be fluorescent materials.

In an exemplary embodiment, the first host material A1 and the second host material A2 may both have a structure selected from a structure represented by formula (I), a structure represented by formula (II), a structure represented by formula (III), a structure represented by formula (IV), a structure represented by formula (V), and a structure represented by formula (VI).

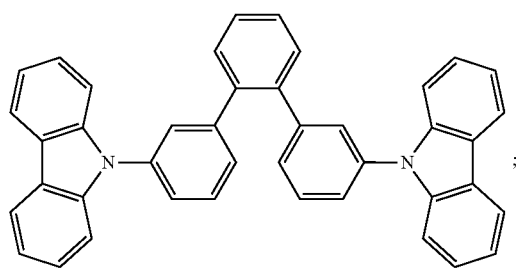

(I)

(II)

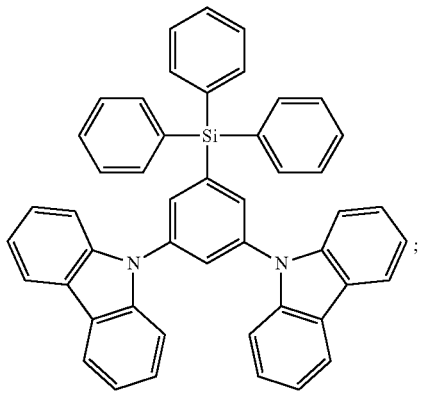

(III)

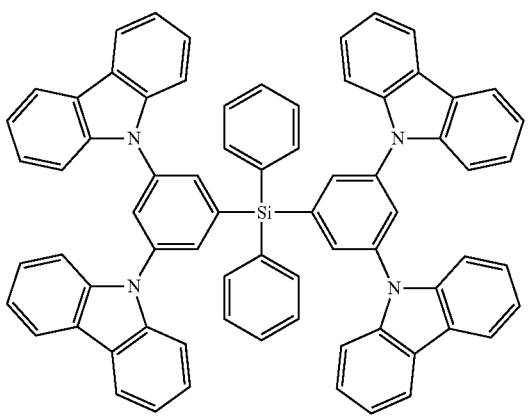

(IV)

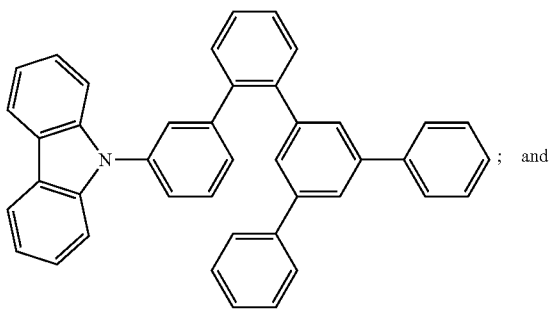

(V); and

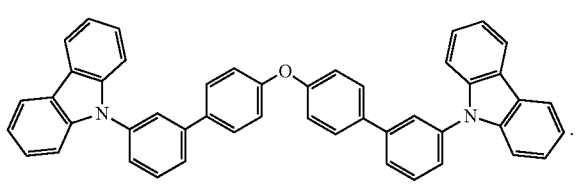

(VI)

In the above chemical formulas, N is nitrogen and Si is silicon. A simulation test is performed in terms of the HOMO energy levels, the LUMO energy levels, and the lowest triplet energies T1 of the structure represented by formula (I), the structure represented by formula (II), the structure represented by formula (III), the structure represented by formula (IV), the structure represented by formula (V), and the structure represented by formula (VI). The results of the test are shown in Table 1 below.

TABLE 1

| Structural formula | HOMO energy level | LUMO energy level | T1 |
|---|---|---|---|
| I | 5.9 | 2.4 | 3.0 |
| II | 6.1 | 2.5 | 2.77 |
| III | 6.1 | 2.5 | 3.0 |
| IV | 6.1 | 2.5 | 3.0 |
| V | 6.0 | 2.5 | 2.75 |
| VI | 6.0 | 2.6 | 2.73 |

For example, referring to Table 1, it can be seen that for the compounds represented by formula (I), the HOMO energy level is 5.9, the LUMO energy level is 2.4, and the lowest triplet energy T1 is 3.0.

In an exemplary embodiment, the first sensitizing material A1 and the second sensitizing material A2 may both have a structure selected from a structure represented by formula (VII), a structure represented by formula (VIII), a structure represented by formula (IX), and a structure represented by formula (X).

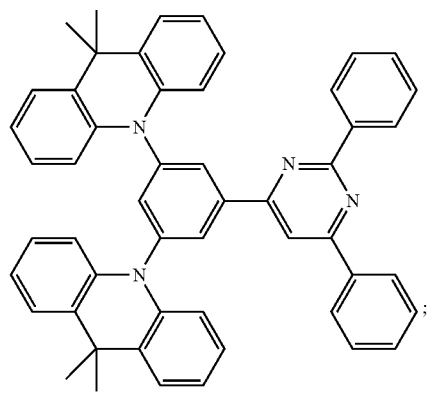

(VII)

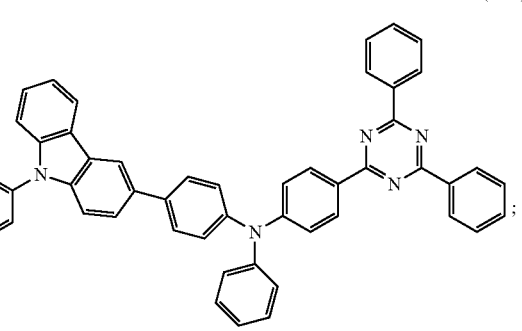

(VIII)

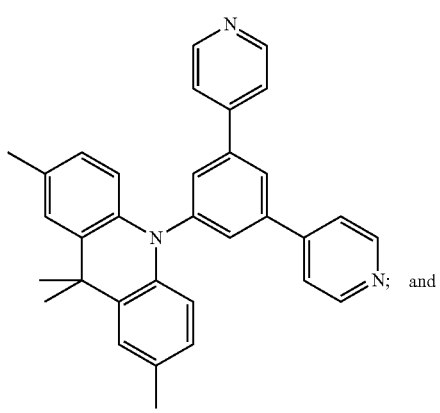

(IX) and

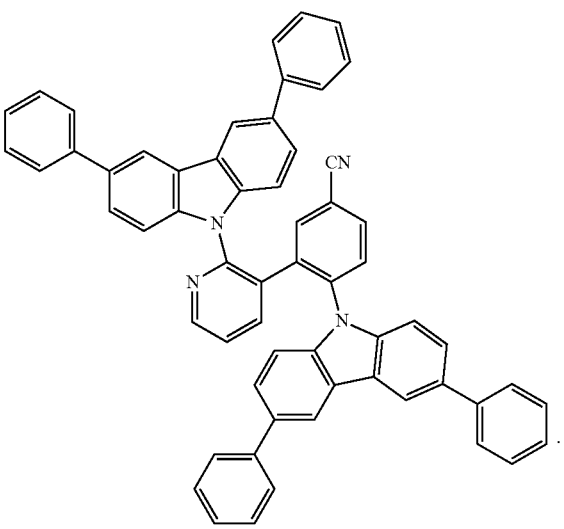

(X)

In the above chemical formulas, CN is cyano. A simulation test is performed in terms of the lowest singlet energies S1, the lowest triplet energies T1, and differences between the lowest singlet energies S1 and the lowest triplet energies T1 of the structure represented by the formula (VII), the structure represented by formula (VIII), the structure represented by formula (IX), and the structure represented by formula (X). The results of the test are shown in Table 2 below.

TABLE 2

| Structural formula | S1 | T1 | S1 – T1 |
|---|---|---|---|
| VII | 2.98 | 2.91 | 0.07 |
| VIII | 2.82 | 2.65 | 0.17 |
| IX | 2.91 | 2.87 | 0.04 |
| X | 2.85 | 2.72 | 0.13 |

For example, referring to Table 2, it can be seen that for the compounds represented by formula (VII), the lowest singlet energy S1 is 2.98, the lowest triplet energy T1 is 2.91, and the difference between the lowest singlet energy S1 and the lowest triplet energy T1 is 0.07.

In an exemplary embodiment, the first luminescent material and the second luminescent material may both have a structure selected from a structure represented by formula (XI), a structure represented by formula (XII), a structure represented by formula (XIII), and a structure represented by formula (XIV).

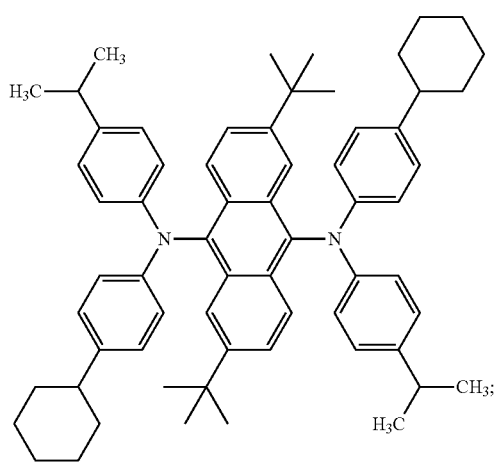

(XI)

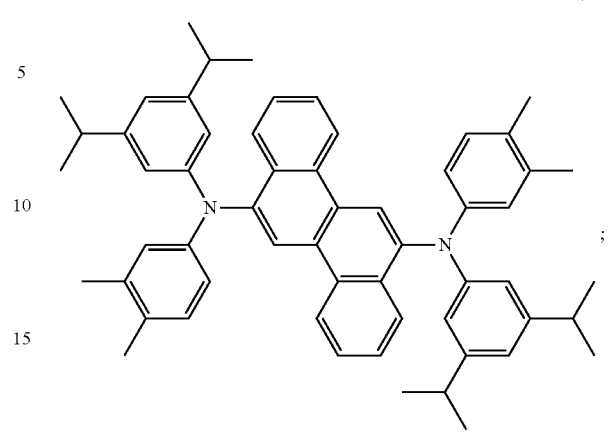

(XIV)

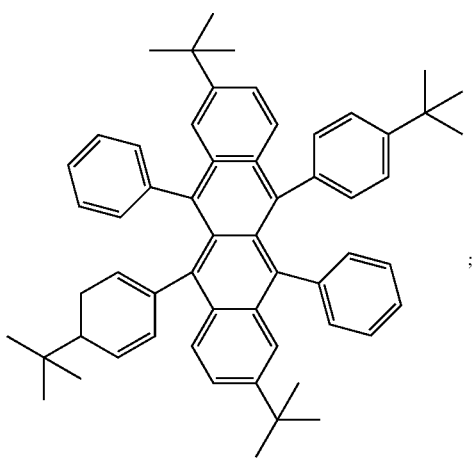

(XII)

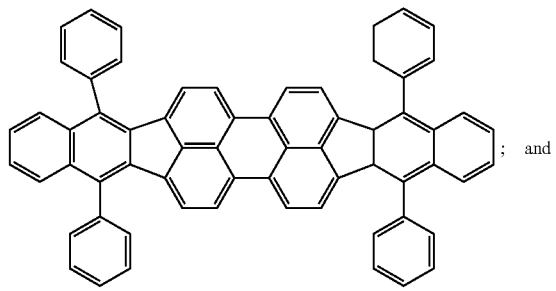

(XIII) ; and

In the above chemical formulas, CH₃ and H₃C are both methyl.

In the embodiments of the present disclosure, the anode layer 102 may be prepared from a material having a relatively higher work function. Optionally, the display substrate 10 provided in the embodiments of the present disclosure may be a top-emission display substrate, and thus the anode layer 102 is required to have certain reflection characteristics. The anode layer 102 not only includes a transparent oxide layer formed from a transparent oxide, but also includes a metal layer formed from a metal material. For example, the material of the anode layer 102 may include ITO and silver (Ag). Alternatively, the material of the anode layer 102 may include IZO and Ag. Moreover, in order to ensure the reflectivity of the anode layer 102, a thickness of the metal layer can be greater than that of the transparent oxide layer. For example, the thickness of the transparent oxide layer may range from 5 nm to 10 nm. The thickness of the metal layer may range from 80 nm to 100 nm. The reflectance of the anode layer 102 in a display area of the base substrate 101 ranges from 85% to 95%.

Moreover, the material of the cathode layer 106 may include one of magnesium (Mg), silver (Ag), and aluminum (Al). The material of the cathode layer 106 may include Mg and Ag. A ratio of the doping proportion of Mg to the doping proportion of Ag ranges from 1/9 to 3/7. Optionally, the cathode layer 106 has a light transmittance of 50% to 60% for light at a wavelength of 530 nm.

Alternatively, the display substrate 10 provided in the embodiments of the present disclosure may be a bottom-emission display substrate, and thus the anode layer 102 may be prepared from a transparent oxide material, for example, indium tin oxide (ITO) or indium zinc oxide (IZO) may be applied to prepare the anode layer 102. Moreover, if the display substrate is a bottom-emission display substrate, in order to ensure the light transmission performance of the anode layer 102, the thickness of the anode layer 102 should not be too thick. For example, the thickness of the anode layer 102 may range from 80 nm to 200 nm.

Moreover, in order to ensure that the cathode layer 106 has good reflection characteristics, the thickness of the cathode layer 106 may be greater than or equal to 80 nm.

In the embodiments of the present disclosure, a main function of the hole block layer 105 is to block the holes generated by the anode layer 102 and the excitons generated in the electron diffusion layer 104. The thickness of the hole block layer 105 may range from 2 nm to 10 nm.

In order to realize the blocking function of the excitons generated in the electron diffusion layer 104, the lowest triplet energy T1(D) of a material D of the hole block layer 105 is required to be greater than the lowest triplet energy T1(A1) of the first host material A1 of the electron diffusion layer 104, that is, T1(D)>T1(A1). Accordingly, the voltage required by the display substrate 10 can be reduced, and the luminous efficiency of the display substrate can be improved. Moreover, the difference between the HOMO energy level of the material D of the hole block layer 105 and the HOMO energy level of the first host material A1 of the electron diffusion layer 104 is greater than 0.1 eV.

In the embodiment of the present disclosure, by providing electron diffusion layers 104 of different thicknesses, a plurality of display substrates 10 are obtained. Tests are performed on the display substrates 10 having electron diffusion layers 104 of different thicknesses for the voltages, efficiencies, and service lives thereof, and chromaticity coordinates of a certain pixel. The results of the tests are shown in Table 3 below. In order to ensure the accuracy of the test results, current densities in the respective display substrates 10 can be made equal, for example, taking 15 mA/cm$^2$ (milliamps/square centimeter) as an example. Moreover, the thicknesses and materials of other film layers than the electron diffusion layer 104 in the display substrates 10 are correspondingly identical.

TABLE 3

| Display substrate No. | Thickness of electron diffusion layer 104 | Current density (mA/cm$^2$) | Voltage | Luminous efficiency | Chromaticity coordinate | Service life |
|---|---|---|---|---|---|---|
| 1 | None | 15 | 100% | 100% | (0.28, 0.68) | 100% |
| 2 | 5 nm |  | 101% | 119% | (0.27, 0.68) | 90% |
| 3 | 10 nm |  | 105% | 124% | (0.26, 0.68) | 71% |

Referring to Table 3, it can be seen that by adding an electron diffusion layer 104 in the display substrate 10, the luminous efficiency can be increased, and the luminous efficiency of the display substrate 10 is positively correlated with the thickness of the electron diffusion layer 104. In other word, the thicker the thickness of the electron diffusion layer 104 is, the higher the luminous efficiency is and the thinner the thickness of the electron diffusion layer 104 is, the lower the luminous efficiency is.

In an exemplary embodiment, assuming that when no electron diffusion layer 104 is disposed in the display substrate 10 (display substrate No. 1), the luminous efficiency is 100%; then when the thickness of the electron diffusion layer 104 in the display substrate 10 is 5 nm (display substrate No. 2), the luminous efficiency is 119%; and when the thickness of the electron diffusion layer 104 in the display substrate 10 is 10 nm (display substrate No. 3), the luminous efficiency is 124%.

Referring to Table 3 above, the addition of the electron diffusion layer 104 in the display substrate 10 has little effect on the voltage required by the display substrate 10. In an exemplary embodiment, assuming that when no electron diffusion layer 104 is disposed in the display substrate 10, the required voltage is 100%; then when the thickness of the electron diffusion layer 104 in the display substrate 10 is 5 nm, the required voltage is 101%; and when the thickness of the electron diffusion layer 104 in the display substrate 10 is 10 nm, the required voltage is 105%.

Moreover, referring to Table 3, it can be seen that the addition of the electron diffusion layer 104 in the display substrate 10 has little effect on the chromaticity coordinates of the pixels in the display substrate 10. That is, the newly added electron diffusion layer 104 can effectively improve the luminous efficiency of the display substrate 10 under the condition that the chromaticity coordinates have only slight change.

However, referring to Table 3 above, it can be seen that the addition of the electron diffusion layer 104 in the display substrate 10 may affect the service life of the display substrate 10. In other words, the service life of the display substrate 10 is negatively correlated with the thickness of the electron diffusion layer 104. That is, the thicker the thickness of the electron diffusion layer 104 is, the shorter the service life of the display substrate 10 is and the thinner the thickness of the electron diffusion layer 104 is, the longer the service life of the display substrate 10 is.

In an exemplary embodiment, assuming that when no electron diffusion layer 104 is provided in the display substrate 10, the service life of the display substrate 10 is 100%; then when the thickness of the electron diffusion layer 104 in the display substrate 10 is 5 nm, the service life of the display substrate 10 is 90%; and when the thickness of the electron diffusion layer 104 in the display substrate 10 is 10 nm, the service life of the display substrate is 71%.

Therefore, in the embodiments of the present disclosure, in order to ensure the service life of the display substrate 10 while improving the luminous efficiency of the display substrate 10, the thickness of the electron diffusion layer 104 should not be too thick. Optionally, the thickness of the electron diffusion layer 104 may range from 1 nm to 10 nm. For example, the thickness of the electron diffusion layer 104 ranges from 1 nm to 8 nm.

Figure 2:
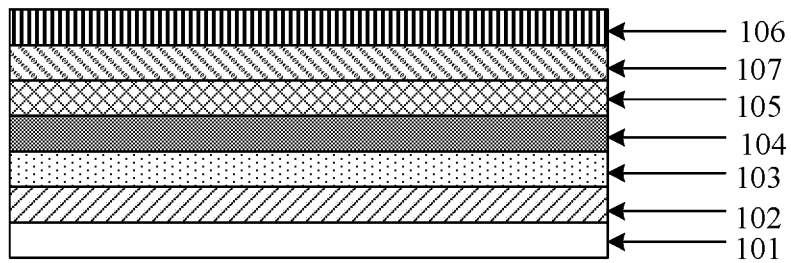
FIG. 2 is a schematic structural diagram of another display substrate according to an embodiment of the present disclosure.

FIG. 2 is a schematic structural diagram of another display substrate according to an embodiment of the present disclosure. Referring to FIG. 2, it can be seen that the display substrate 10 may further include an electron transport layer 107. The electron transport layer 107 may be located between the hole block layer 105 and the cathode layer 106. The electron mobility of the electron transport layer 107 may be greater than or equal to a mobility threshold.

Since the electron mobility of the electron transport layer 107 is greater than or equal to the mobility threshold, that is, the electron mobility of the electron transport layer 107 may be relatively large. Thus the transport speed of electrons in the electron transport layer 107 is relatively high, which can prevent the holes generated by the anode layer 102 from having been transported to the interface between the electron diffusion layer 104 and the hole block layers 105 before the electrons generated by the cathode layer 106 and the holes generated by the anode layer 102 meet. Furthermore, this can also avoid that the electrons generated by the cathode layer 106 and the holes generated by the anode layer 102 meet and form excitons at an interface between the electron transport layer 107 and the hole block layer 105, ensuring the luminous efficiency of the display substrate 10.

Optionally, the mobility threshold may be $10^{-6}$ cm$^2$/V·S (square centimeter/volt·second), that is, the electron mobility of the electron transport layer 107 may be greater than or equal to $10^{-6}$ cm$^2$/V·S.

Figure 3:
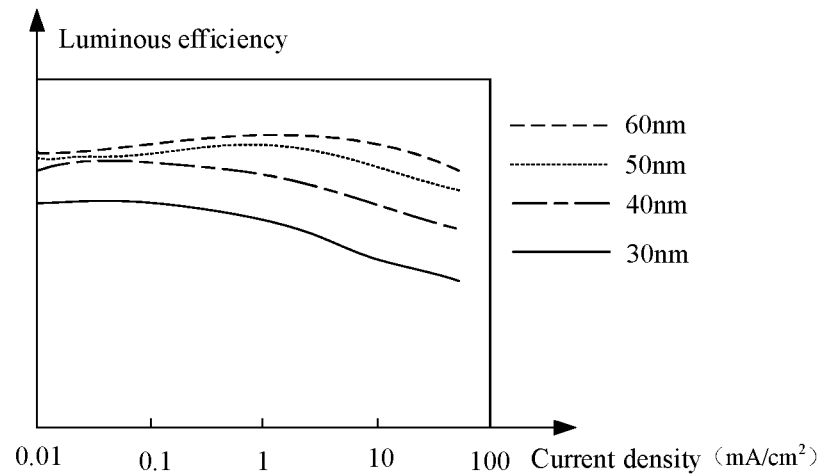
FIG. 3 is a schematic diagram showing a relationship between thickness of electron transport layer and luminous efficiency according to an embodiment of the present disclosure.

FIG. 3 is a schematic diagram showing the relationship between the thickness of the electron transport layer and the luminous efficiency according to an embodiment of the present disclosure. FIG. 3 shows a relationship between the luminous efficiency and the current density when the thickness of the electron transport layer is 30 nm, 40 nm, 50 nm, and 60 nm, respectively. Referring to FIG. 3, it can be seen that when the current density is same, the thicker the thickness of the electron transport layer 107 is, the higher the luminous efficiency is. Moreover, as the current density increases, the luminous efficiency gradually increases at first and then gradually decreases. For example, for a display substrate provided with an electron transport layer 107 having a thickness of 50 nm or 60 nm, when the current density is less than 1 mA/cm$^2$, the luminous efficiency gradually increases as the current density increases. When the current density is less than 1 mA/cm$^2$, the luminous efficiency is maximum. When the current density is greater than 1 mA/cm$^2$, the luminous efficiency gradually decreases.

The reason why the luminous efficiency first gradually increases as the current density increases is because the recombination zone of excitons gradually moves from the electron diffusion layer 104 to the light-emitting layer 103. That is, the holes generated by the anode layer 102 and the electrons generated by the cathode layer 106 can meet and generate excitons in the light-emitting layer 103. This can avoid the deterioration influence on the display substrate 10 caused by the accumulation of excitons at an interface between the light-emitting layer 103 and the hole block layer 105, which can improve the utilization rate of excitons, reduce the quenching of excitons, and prolong the service life of the display substrate 10. After that, the reason why the luminous efficiency gradually decreases as the current density increases is because the loss of excitons during the light-emitting process of the display substrate.

In the embodiment of the present disclosure, by providing electron diffusion layers 104 of different thicknesses, a plurality of display substrates 10 are obtained. Tests are performed on the display substrates 10 having electron diffusion layers 104 of different thicknesses for the voltages, efficiencies, and service lives thereof. The results of the tests are shown in Table 4 below. In order to ensure the accuracy of the test results, current densities in the respective display substrates 10 can be made equal, for example, taking 15 mA/cm$^2$ (milliamps/square centimeter) as an example. Moreover, the thicknesses and materials of other film layers than the electron diffusion layer 104 in the respective display substrates are correspondingly identical.

TABLE 4

| Display substrate No. | Thickness of electron transport layer 107 | Current density (mA/cm$^2$) | Voltage | Luminous efficiency | Service life |
|---|---|---|---|---|---|
| 4 | 30 nm | 15 | 100% | 100% | 100% |
| 5 | 40 nm |  | 100% | 132% | 111% |
| 6 | 50 nm |  | 101% | 155% | 128% |
| 7 | 60 nm |  | 102% | 167% | 144% |

Referring to Table 4, it can be seen that by increasing the thickness of the electron transport layer 107 in the display substrate 10, the luminous efficiency can be increased. That is, the luminous efficiency of the display substrate 10 is positively correlated with the thickness of the electron transport layer 107. The thicker the thickness of the electron transport layer 107 is, the higher the luminous efficiency is. The thinner the thickness of the electron transport layer 107 is, the lower the luminous efficiency is.

In an exemplary embodiment, assuming that when the thickness of the electron transport layer 107 in the display substrate 10 is 30 nm (display substrate No. 4), the luminous efficiency is 100%; then when the thickness of the electron transport layer 107 in the display substrate 10 is 40 nm (display substrate No. 5), the luminous efficiency is 132%; and when the thickness of the electron transport layer 107 in the display substrate 10 is 50 nm (display substrate No. 6), the luminous efficiency is 155%; and when the thickness of the electron transport layer 107 in the display substrate 10 is 60 nm, the luminous efficiency is 167%.

Referring to Table 4 above, the increase of the thickness of the electron transport layer 107 in the display substrate 10 has little effect on the voltage required by the display substrate 10. For example, assuming that when the thickness of the electron transport layer 107 in the display substrate 10 is 30 nm, the required voltage is 100%, then when the thickness of the electron transport layer 107 in the display substrate 10 is 40 nm, the required voltage is 100%; and when the thickness of the electron transport layer 107 in the display substrate 10 is 50 nm, the required voltage is 101%; and when the thickness of the electron transport layer 107 in the display substrate 10 is 60 nm, the required voltage is 102%.

Moreover, referring to Table 4, it can be seen that by increasing the thickness of the electron transport layer 107 in the display substrate 10, the service life of the display substrate 10 can be prolonged. That is, the service life of the display substrate 10 is positively correlated with the thickness of the electron transport layer 107. The thicker the thickness of the electron transport layer 107 is, the longer the service life of the display substrate 10 is and the thinner the thickness of the electron transport layer 107 is, the shorter the service life of the display substrate 10 is.

In an exemplary embodiment, assuming that when the thickness of the electron transport layer 107 in the display substrate 10 is 30 nm, the service life of the display substrate 10 is 100%, then when the thickness of the electron transport layer 107 in the display substrate 10 is 40 nm, the service life of the display substrate 10 is 111%; when the thickness of the electron transport layer 107 in the display substrate 10 is 50 nm, the service life of the display substrate 10 is 128%; and when the thickness of the electron transport layer 107 in the display substrate 10 is 60 nm, the service life of the display substrate 10 is 144%.

In the embodiment of the present disclosure, by providing electron transport layers 104 with different electron mobilities, a plurality of display substrates 10 are obtained. Tests are performed on the display substrates 10 for the voltages, efficiencies, and service lives thereof. The results of the tests are shown in Table 5 below. In order to ensure the accuracy of the test results, current densities in the respective display substrates 10 can be made equal, for example, taking 15 mA/cm$^2$ (milliamps/square centimeter) as an example. Moreover, the thicknesses and materials of other film layers than the electron transport layer 107 in the respective display substrates 10 are correspondingly identical.

TABLE 5

| Display substrate No. | Electron mobility of electron transport layer 107 | Current density (mA/cm²) | Voltage | Luminous efficiency | Service life |
|---|---|---|---|---|---|
| 8 | 100% | 15 | 100% | 100% | 100% |
| 9 | 78% |  | 102% | 100% | 240% |

Referring to Table 5 above, it can be seen that by reducing the electron mobility of the electron transport layer 107, the service life of the display substrate 10 can be prolonged to a greater extent. Moreover, the reduction of the electron mobility of the electron transport layer 107 has little effect on the voltage required by the display substrate 10 and the luminous efficiency.

In an exemplary embodiment, assuming that when the electron mobility of the electron transport layer 107 in the display substrate 10 is 100% (display substrate No. 8), the service life is 100%, then when the electron mobility of the electron transport layer 107 in the display substrate 10 is 78% (display substrate No. 9), the service life is 240%.

However, when the electron mobility of the electron transport layer 107 is too low, the electron transport speed will become relatively low, which may further affect the luminous efficiency. Therefore, in the embodiment of the present disclosure, the electron mobility of the electron transport layer 107 should not be too low.

As the electron mobility of the electron transport layer 107 is negatively correlated with the thickness of the electron transport layer 107, that is, the thicker the thickness of the electron transport layer 107 is, the lower the electron mobility of the electron transport layer 107 is, and the thinner the thickness of the electron transport layer 107 is, the higher the electron mobility of the electron transport layer 107 is. Accordingly, in order to prevent the electron mobility of the electron transport layer 107 from being too low, the thickness of the electron transport layer 107 may be prevented from being too thick. Optionally, the thickness of the electron transport layer 107 may range from 20 nm to 70 nm. For example, the thickness of the electron transport layer 107 may range from 40 nm to 60 nm.

In the embodiments of the present disclosure, the electron mobility of the electron transport layer 107 may also relate to the material of the electron transport layer 107. Optionally, the material of the electron transport layer 107 may include thiophene materials and lithium quinolate. Alternatively, the material of the electron transport layer 107 may include imidazole materials and lithium quinolate. Alternatively, the material of the electron transport layer 107 may include azine derivatives and lithium quinolate. Optionally, a doping proportion of the lithium quinolate may range from 30% to 70%.

Figure 4:
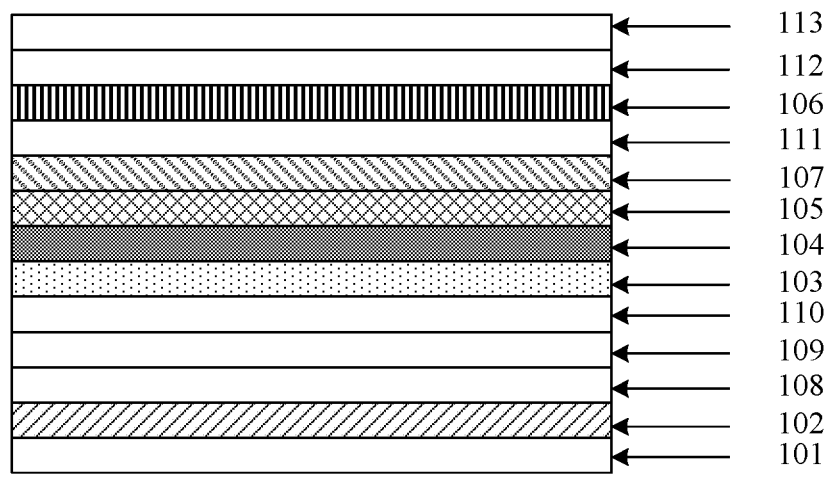
FIG. 4 is a schematic structural diagram of yet another display substrate according to an embodiment of the present disclosure.

FIG. 4 is a schematic structural diagram of yet another display substrate according to an embodiment of the present disclosure. Referring to FIG. 4, it can be seen that the display substrate may further include a hole injection layer (HIL) 108, a hole transport layer (HTL) 109, an electron block layer (EBL) 110, an electron transport layer (ETL) 107, an electron injection layer (EIL) 111, a capping layer (CPL) 112, and an encapsulating layer 113.

The hole injection layer 108 may be located on a side of the anode layer 102 away from the base substrate 101. The hole transport layer 109 may be located on a side of the hole injection layer 108 away from the anode layer 102. The electron block layer 110 may be located on a side of the hole transport layer 109 away from the hole injection layer 108. The electron transport layer 107 may be located on a side of the hole block layer 105 away from the base substrate 101. The electron injection layer 111 may be located on a side of the electron transport layer 107 away from the base substrate 101. The capping layer 112 may be located on a side of the cathode layer 106 away from the base substrate 101. The encapsulation layer 113 may be located on a side of the capping layer 112 away from the cathode layer 106.

Referring to FIG. 4, the anode layer 102, the hole injection layer 108, the hole transport layer 109, the electron block layer 110, the light-emitting layer 103, the electron diffusion layer 104, the hole block layer 105, the electron transport layer 107, the electron injection layer 111, the cathode layer 106, the capping layer 112, and the encapsulating layer 113 are in a stacked arrangement along a direction away from the base substrate 101.

In the embodiments of the present disclosure, the main function of the hole injection layer 108 is to reduce an injection potential barrier of the holes generated by the anode layer 102 into the light-emitting layer 103, and to improve the hole injection efficiency.

Optionally, the hole injection layer 108 is prepared from a single material. For example, the material of the hole injection layer 108 may include 2,3,6,7,10,11-hexacyano-1,4,5,8,9,12-hexaazatriphenylene (Hexaazatriphenylenehexacabonitrile, HATCN) or copper phthalocyanine (CuPc). Alternatively, the hole injection layer 108 may be prepared from a plurality of materials. For example, the material of the hole injection layer 108 may include N,N'-Bis-(1-naphthalenyl)-N,N'-bis-phenyl-(1,1'-biphenyl)-4,4'-diamine or N,N'-Bis(naphthalen-1-yl)-N,N'-bis(phenyl)benzidine (NPB) and 2,3,5,6-tetrafluoro-7,7,8,8-tetracyanoquinodimethane (F4TCNQ). The doping concentration of F4TCNQ may range from 0.5% to 10%. Alternatively, the material of the hole injection layer 108 may include 4,4'-cyclohexylidenebis[N,N-bis(p-tolyl)aniline] (TAPC) and manganese oxide (MnO3). The doping concentration of MnO3 may range from 0.5% to 10%. Moreover, the thickness of the hole injection layer 108 may range from 5 nm to 20 nm.

Optionally, the hole transport layer 109 may be prepared by evaporation of a carbazole material with a higher hole mobility. Moreover, the HOMO energy level of the material of the hole transport layer 109 ranges from −5.2 eV to −5.6 eV. The thickness of the hole transport layer 109 may range from 100 nm to 140 nm.

Optionally, the main function of the electron block layer 110 is to transfer the holes generated by the anode layer 102, block the electrons generated by the cathode layer 106, and block the excitons generated in the light-emitting layer 103. A thickness of the electron block layer 110 ranges from 1 nm to 10 nm.

In order to make the electron block layer 110 have the function of blocking the excitons generated in the light-emitting layer 103, the lowest triplet energy T1(E) of the material E of the electron block layer 110 is required to be greater than the lowest triplet energy T1(A2) of the second host material A2 of the light-emitting layer 103, that is, T1(E)>T1(A2). As a result, the voltage required by the display substrate can be reduced, and the luminous efficiency of the display substrate 10 can be improved. Moreover, the difference between the HOMO energy level of the material of the electron block layer 110 and the HOMO energy level of the second host material A2 of the light-emitting layer 103 is less than or equal to 0.3 eV.

Optionally, the material of the electron injection layer 111 may include one of lithium fluoride (LiF), 8-hydroxyquinoline lithium (LiQ), ytterbium (Yb), and calcium (Ca). The electron injection layer 111 may be prepared by evaporation of one of the above materials. Moreover, the thickness of the electron injection layer 111 may range from 0.5 nm to 2 nm.

Optionally, the capping layer 112 may be formed by evaporation of organic small molecule materials. The thickness of the capping layer 112 may range from 50 nm to 80 nm. The material of the capping layer 112 has a refractive index greater than 1.8 for light with a wavelength of 460 nm. Moreover, the encapsulating layer 113 may be a sealant encapsulation or a thin-film encapsulation.

In summary, the embodiments of the present disclosure provide a display substrate. In the display substrate, an electron diffusion layer including a first luminescent material is newly added, and the transport speed of holes generated by the anode layer of the display substrate in the electron diffusion layer is less than the transport speed of the holes in the light-emitting layer. Thus, the holes generated by the anode layer and electrons generated by a cathode layer can meet and generate excitons in the electron diffusion layer, which can excite the first luminescent material of the electron diffusion layer to cause the electron diffusion layer to emit light, thus improving the luminous efficiency of the display substrate.

Figure 5:
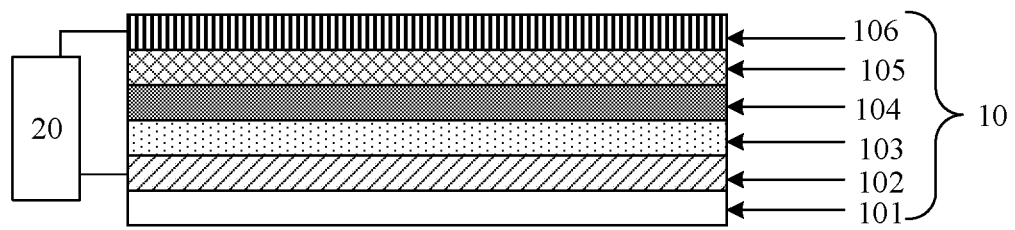
FIG. 5 is a schematic structural diagram of still another display substrate according to an embodiment of the present disclosure.

FIG. 5 is a schematic structural diagram of a display device according to an embodiment of the present disclosure. The display device may include a drive circuit 20 and the display substrate 10 according to the above aspects. The drive circuit 20 may be respectively connected to the anode layer 102 and the cathode layer 106 in the display substrate 10. The drive circuit 20 may provide the anode layer 102 with a first drive voltage, and then the anode layer 102 may generate holes under the driving of the first drive voltage. The drive circuit 20 may provide a second drive voltage for the cathode layer 106, and then the cathode layer 106 may generate electrons under the driving of the second drive voltage.

Optionally, the display device may be any product or component with a display function, such as an electronic paper, an OLED display device, a mobile phone, a tablet computer, a television, a monitor, a notebook computer, a digital photo frame, or a navigator.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display substrate, comprising:
   a base substrate, and an anode layer, a light-emitting layer, an electron diffusion layer, a hole block layer, and a cathode layer which are sequentially stacked along a direction away from the base substrate,
   wherein a material of the electron diffusion layer comprises a first luminescent material, and a transport speed of holes generated by the anode layer in the electron diffusion layer is less than a transport speed of the holes in the light-emitting layer; and
   wherein the material of the electron diffusion layer further comprises a first host material and a first sensitizing material; and
   a material of the light-emitting layer comprises a second host material, a second sensitizing material, and a second luminescent material, and
   wherein a doping proportion of the first sensitizing material is less than that of the second sensitizing material.

2. The display substrate according to claim 1, wherein a difference between the doping proportion of the second sensitizing material and the doping proportion of the first sensitizing material is greater than 5%.

3. The display substrate according to claim 1, wherein a doping proportion of the first host material is greater than that of the second host material; and
   a doping proportion of the first luminescent material is equal to that of the second luminescent material.

4. The display substrate according to claim 3, wherein a difference between the doping proportion of the first host material and the doping proportion of the second host material is greater than 5%.

5. The display substrate according to claim 1, wherein a doping proportion of the first host material is greater than 50%, the doping proportion of the first sensitizing material is greater than 5% and less than or equal to 50%, and a doping proportion of the first luminescent material is greater than 0.5% and less than or equal to 5%; and
   a doping proportion of the second host material is greater than 50%, the doping proportion of the second sensitizing material is greater than 5% and less than or equal to 50%, and a doping proportion of the second luminescent material is greater than 0.5% and less than or equal to 5%.

6. The display substrate according to claim 1, wherein a difference between lowest singlet energy of the first host material and lowest triplet energy of the first host material is greater than or equal to 0.2 eV;
   a difference between lowest singlet energy of the first sensitizing material and lowest triplet energy of the first sensitizing material is less than or equal to 0.2 eV;
   the lowest singlet energy of the first host material is greater than that of the first sensitizing material, and the lowest singlet energy of the first sensitizing material is greater than that of the first luminescent material, wherein a difference between the lowest singlet energy of the first host material and the lowest singlet energy of the first sensitizing material is greater than or equal to 0.1 eV; and
   the lowest triplet energy of the first host material is greater than that of the first sensitizing material, and the lowest triplet energy of the first sensitizing material is greater than the lowest singlet energy of the first luminescent material, wherein a difference between the lowest triplet energy of the first host material and the lowest triplet energy of the first sensitizing material is greater than or equal to 0.1 eV.

7. The display substrate according to claim 1, wherein an absolute value of a difference between highest occupied molecular orbital energy level of the first host material and highest occupied molecular orbital energy level of the first sensitizing material is less than or equal to 0.2 eV;
   a difference between lowest unoccupied molecular orbital energy level of the first host material and lowest unoccupied molecular orbital energy level of the first sensitizing material is less than 0.3 eV; and
   a difference between an absolute value of the highest occupied molecular orbital energy level of the first host material and an absolute value of the lowest unoccupied molecular orbital energy level of the first sensitizing material is greater than the lowest singlet energy of the first sensitizing material.

8. The display substrate according to claim 1, wherein a type of the first host material is identical to that of the second host material;

a type of the first sensitizing material is identical to that of the second sensitizing material; and a type of the first luminescent material is identical to that of the second luminescent material.

9. The display substrate according to claim 8, wherein the first host material and the second host material are both carbazole materials;

the first sensitizing material and the second sensitizing material are thermally activated delayed fluorescent materials or multiple resonance type materials; and the first luminescent material and the second luminescent material are both fluorescent materials.

10. The display substrate according to claim 9, wherein the first host material and the second host material are both one structure selected from a structure represented by formula (I), a structure represented by formula (II), a structure represented by formula (III), a structure represented by formula (IV), a structure represented by formula (V), and a structure represented by formula (VI);

(I)

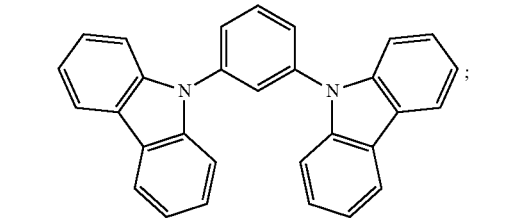

(II)

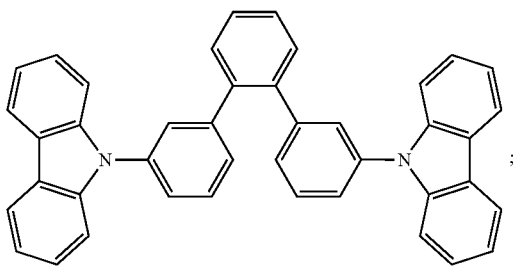

(III)

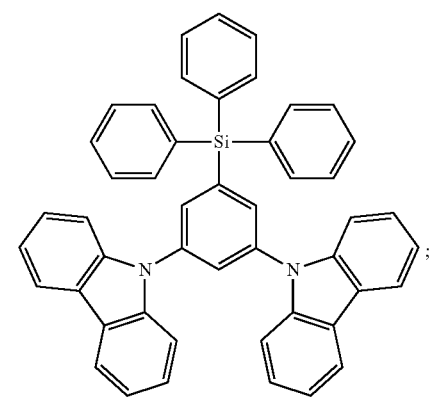

(IV)

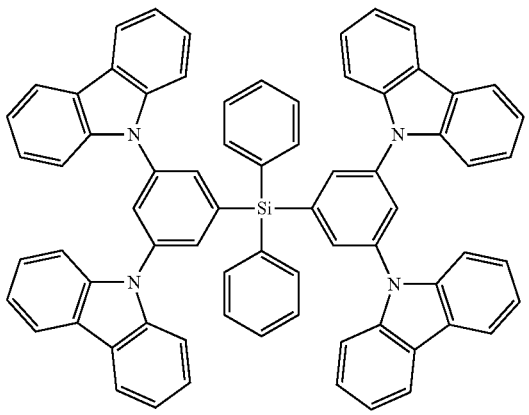

(V)

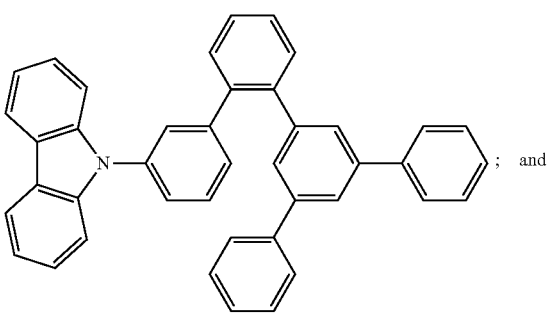

; and (VI)

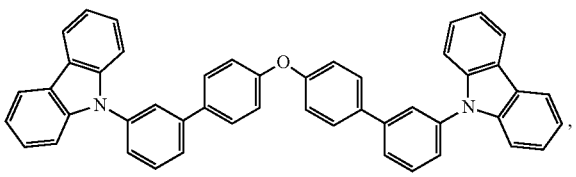

where N is nitrogen and Si is silicon.

11. The display substrate according to claim 9, wherein the first sensitizing material and the second sensitizing material are both one structure selected from a structure represented by formula (VII), a structure represented by formula (VIII), a structure represented by formula (IX), and a structure represented by formula (X);

(VII)

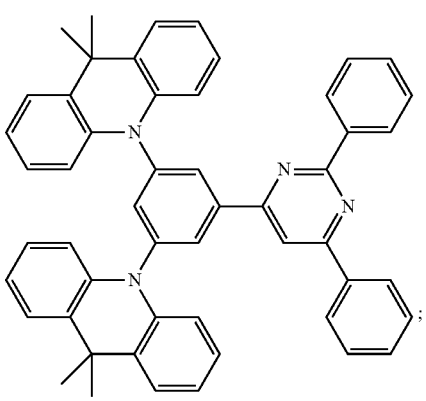

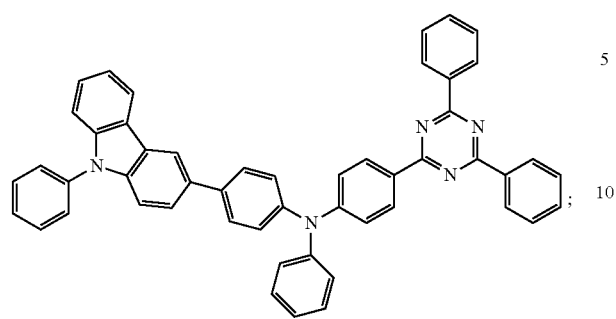

(VIII)

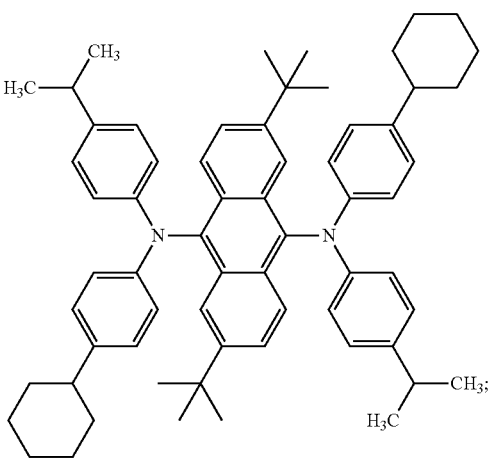

(XI)

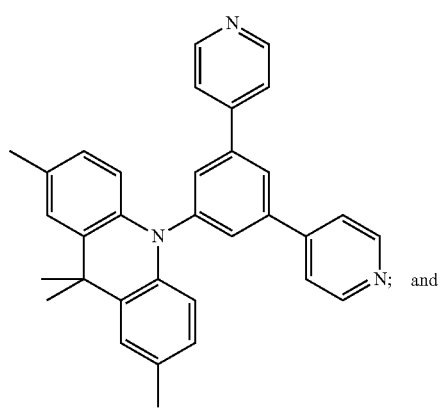

(IX)

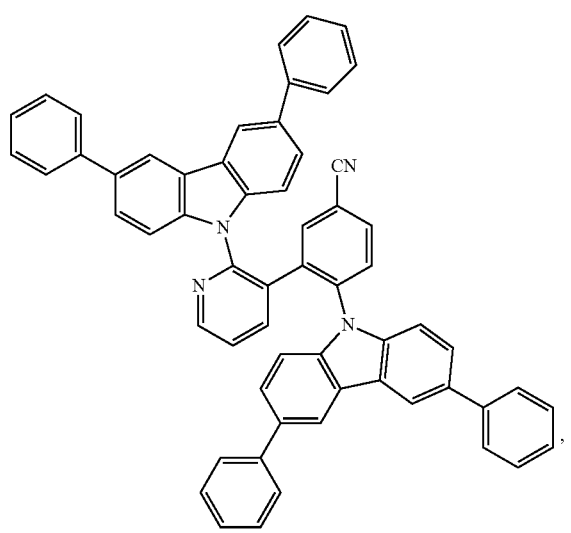

(X)

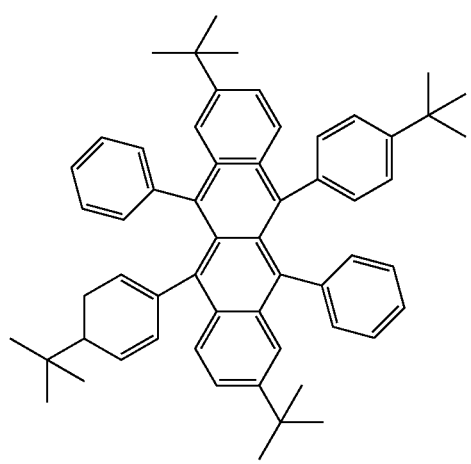

(XII)

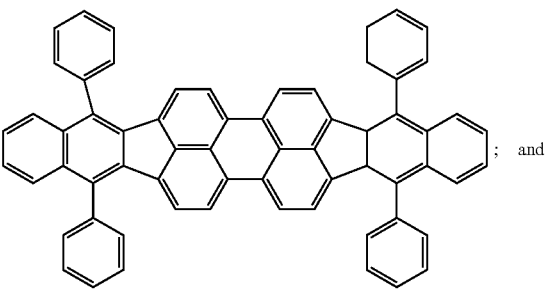

(XIII)

where N is nitrogen and CN is cyano.

12. The display substrate according to claim 9, wherein the first luminescent material and the second luminescent material are both one structure selected from a structure represented by formula (XI), a structure represented by formula (XII), a structure represented by formula (XIII), and a structure represented by formula (XIV);

-continued

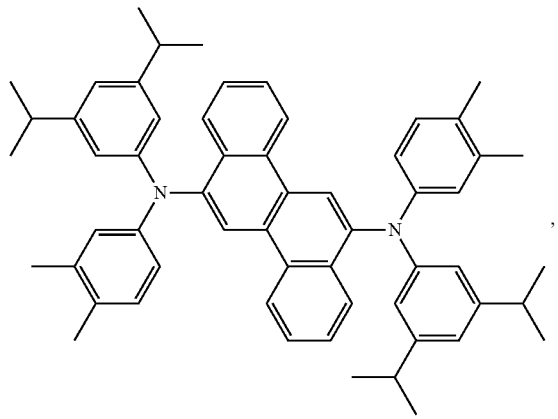

(XIV)

where N is nitrogen, and both CH₃ and H₃C are methyl.

13. The display substrate according to claim 1, wherein a thickness of the electron diffusion layer ranges from 1 nanometer to 10 nanometers.

14. The display substrate according to claim 1, further comprising: an electron transport layer, wherein
the electron transport layer is located between the hole block layer and the cathode layer, and an electron mobility of the electron transport layer is greater than or equal to a mobility threshold.

15. The display substrate according to claim 14, wherein the mobility threshold is $10^{-6}$ cm$^2$/V·sec.

16. The display substrate according to claim 15, wherein a material of the electron transport layer comprises thiophene materials and lithium quinolate; or, the material of the electron transport layer comprises imidazole materials and lithium quinolate; or, the material of the electron transport layer comprises azine derivatives and lithium quinolate.

17. The display substrate according to claim 16, wherein a doping proportion of the lithium quinolate ranges from 30% to 70%.

18. The display substrate according to claim 1, further comprising: a hole injection layer, a hole transport layer, an electron block layer, an electron transport layer, an electron injection layer, a capping layer, and encapsulating layer, wherein
the hole injection layer is located on a side of the anode layer away from the base substrate, the hole transport layer is located on a side of the hole injection layer away from the anode layer, the electron block layer is located on a side of the hole transport layer away from the hole injection layer, the electron transport layer is located on a side of the hole block layer away from the base substrate, the electron injection layer is located on a side of the electron transport layer away from the base substrate, the capping layer is located on a side of the cathode layer away from the base substrate, and the encapsulation layer is located on a side of the capping layer away from the cathode layer.

19. A display device, comprising: a drive circuit and a display substrate according to claim 1, wherein
the drive circuit is respectively connected to the anode layer and the cathode layer in the display substrate; and
wherein the material of the electron diffusion layer further comprises a first host material and a first sensitizing material; and
a material of the light-emitting layer comprises a second host material, a second sensitizing material, and a second luminescent material, and
wherein a doping proportion of the first sensitizing material is less than that of the second sensitizing material.

* * * * *